United States Patent
Luo et al.

(10) Patent No.: US 9,905,998 B2
(45) Date of Patent: *Feb. 27, 2018

(54) LIGHT EMISSION MODULE

(71) Applicant: Global Technology Inc., Ningbo (CN)

(72) Inventors: Jian-Hong Luo, Ningbo (CN);
Chao-Hung Tsai, New Taipei (TW);
Che-Shou Yeh, New Taipei (TW);
Dong-Biao Jiang, Ningbo (CN)

(73) Assignee: Global Technology Inc., Ningbo (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/077,426

(22) Filed: Mar. 22, 2016

(65) Prior Publication Data

US 2017/0063037 A1    Mar. 2, 2017

(30) Foreign Application Priority Data

Aug. 24, 2015 (CN) ............ 2015 2 0640931 U

(51) Int. Cl.
*H01S 3/13* (2006.01)
*H01S 5/0683* (2006.01)
*H01S 5/022* (2006.01)

(52) U.S. Cl.
CPC ........ *H01S 5/0683* (2013.01); *H01S 5/02252* (2013.01); *H01S 5/02284* (2013.01)

(58) Field of Classification Search
CPC .... H01S 5/0683; H01S 5/042; H01S 5/02284; H01S 5/02288
See application file for complete search history.

(56) References Cited

U.S. PATENT DOCUMENTS

| | | |
|---|---|---|
| 4,470,143 A | 9/1984 | Kitamura et al. |
| 4,750,799 A | 6/1988 | Kawachi et al. |
| 5,032,879 A | 7/1991 | Buchmann et al. |
| 5,438,208 A | 8/1995 | Takemoto |
| 5,668,823 A | 9/1997 | Harrison et al. |
| 6,374,021 B1 | 4/2002 | Nakanishi et al. |
| 6,567,590 B1 | 5/2003 | Okada et al. |
| 7,013,056 B2 | 3/2006 | Lin et al. |
| 7,106,980 B2 | 9/2006 | Nakanishi et al. |

(Continued)

FOREIGN PATENT DOCUMENTS

JP     2004273782 A  *  9/2004  ............ H01S 5/022

OTHER PUBLICATIONS

U.S. Office Action dated Jan. 9, 2017, received in U.S. Appl. No. 15/077,368, 18 pgs.

*Primary Examiner* — Yuanda Zhang
(74) *Attorney, Agent, or Firm* — Grossman Tucker Perreault & Pfleger, PLLC; Norman S. Kinsella

(57) ABSTRACT

A light emission module includes a base, a laser diode driver, a laser diode and a monitor photodiode. The laser diode driver, the laser diode and the monitor photodiode are disposed on the base. The monitor photodiode and the laser diode are located close to a front end of the laser diode driver. A rear side of the laser diode facing the front end of the laser diode driver. A end surface at the front end of the laser diode driver, a side surface at the rear side of the laser diode and a light receiving surface of the monitor photodiode are arranged in a triangle shape for reflecting a light emitted from the rear side of the laser diode to the light receiving surface of the monitor photodiode by the end surface of the laser diode driver.

10 Claims, 1 Drawing Sheet

(56) References Cited

U.S. PATENT DOCUMENTS

2002/0057876 A1 5/2002 Yamabayashi et al.
2003/0102496 A1 6/2003 Kuhara et al.
2004/0222439 A1 11/2004 Musk
2005/0068996 A1 3/2005 Narayan
2009/0269067 A1 10/2009 Kihara et al.

* cited by examiner

LIGHT EMISSION MODULE

CROSS-REFERENCE TO RELATED APPLICATIONS

This non-provisional application claims priority under 35 U.S.C. § 119(a) on Patent Application No(s). 201520640931.8 filed in China on Aug. 24, 2015, the entire contents of which are hereby incorporated by reference.

TECHNICAL FIELD

The disclosure relates to the fiber-optic communication, more particularly to a light emission module.

BACKGROUND

In a high speed optical transmission system, a light emission module in a light transceiver plays an important role, especially a high-speed laser diode module with a speed higher than 25 Gbps. In this light emission module, a length of a connecting line between a laser diode and a laser diode driver seriously affects the quality of the signal transmission. Therefore, the shorter a distance between the laser diode and the laser diode driver is, the better the quality of the signal transmission is. In order to monitor the operation of the laser diode, which emits the laser from the front side and leaks a light from the rear side, a monitor photodiode is disposed at the rear side of the laser diode. The monitor photodiode detects the light leaked from the rear side of the laser diode so as to monitor the operation of the laser diode.

In the conventional light emission module, the monitor photodiode is disposed right behind the rear side of the laser diode for detecting the light leaked from the rear side of the laser diode. In order to prevent the light incident on a light receiving surface of the monitor photodiode from reflecting back to the laser diode, the light receiving surface of the monitor photodiode is tilted relative to an emission axis of the laser diode. In high-speed laser diode module, the laser diode and the laser diode driver are requested to be assembled in one module. In order to minimize the distance between the laser diode and the laser diode driver, the laser diode driver is disposed at a side of the laser diode which is between the front side and the rear side of the laser diode. However, a width of the light emission module is increased so that a size of the light transceiver is increased together with the width of the light emission module.

SUMMARY

The disclosure relates to a light emission module, which has minimized size, kept the function of the monitor photodiode and minimized the distance between the laser diode and the laser diode driver.

According to one embodiment of the present disclosure, a light emission module includes a base, a laser diode driver, a laser diode and a monitor photodiode. The laser diode driver, the laser diode and the monitor photodiode are disposed on the base. The monitor photodiode and the laser diode are located close to a front end of the laser diode driver. A rear side of the laser diode facing the front end of the laser diode driver. The laser diode driver has an end surface located at the front end. The laser diode has a side surface located the rear side. The monitor photodiode has a light receiving surface. The end surface of the laser diode driver, the side surface of the laser diode and the light receiving surface of the monitor photodiode are arranged in a triangle shape for reflecting a light emitted from the rear side of the laser diode to the light receiving surface of the monitor photodiode by the end surface of the laser diode driver.

According to the light emission module of the disclosure, a little light emitted from the rear side is incident on the light receiving surface of the monitor photodiode by reflection of the end surface of the laser diode driver; therefore, the monitor photodiode can monitor the operation of the laser diode. Moreover, the monitor photodiode and the laser diode can be disposed close to the front end of the laser diode driver but a lateral side of the laser diode driver so that the width of the base is greatly minimized. In addition, the monitor photodiode has no need to be disposed behind the rear side of the laser diode, and there is no element disposed between the laser diode and the laser diode driver; as a result, the distance between the laser diode and the laser diode driver can be very short.

According to the light emission module of the disclosure, an angle between the end surface of the laser diode driver and an emission axis of the laser diode is from 20 degrees to 60 degrees. The arrangement of the laser diode driver, the laser diode and the monitor photodiode satisfies the above condition so that the light emitted from the rear side of the laser diode can be incident on the light receiving surface of the monitor photodiode by the reflection of the end surface of the laser diode driver. Moreover, the arrangement of the reflecting mirror, the laser diode and the monitor photodiode satisfying the above condition also minimizes the distance between the arrangement of the reflecting mirror, the laser diode and the monitor photodiode. Therefore, a spaced occupied by the reflecting mirror, the laser diode and the monitor photodiode on the base is minimized.

According to the light emission module of the disclosure, the angle between the end surface of the laser diode driver and the emission axis of the laser diode is from 35 degrees to 45 degrees. The light emission module of the disclosure satisfying the above condition is more preferable.

According to the light emission module of the disclosure, the monitor photodiode is tilted for reflecting the light incident on the light receiving surface of the monitor photodiode from the reflecting mirror to a lateral side of the laser diode. This structure prevents the light incident on the light receiving surface of the monitor photodiode being reflected and entering the laser diode. Specifically, the interference between the light reflected by the reflecting mirror and the laser emitted by the laser diode can be prevented.

BRIEF DESCRIPTION OF THE DRAWINGS

The present disclosure will become more understood from the detailed description given hereinbelow and the accompanying drawings which are given by way of illustration only and thus are not limitative of the present disclosure and wherein.

DETAILED DESCRIPTION

Figure 1:
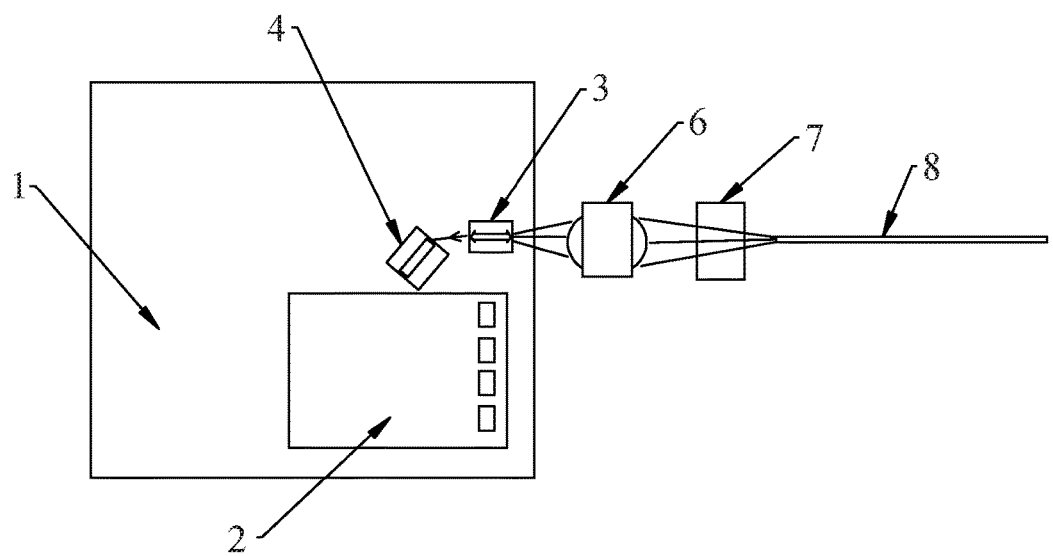
FIG. 1 is a schematic view of a conventional light emission module.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is a schematic view of a conventional light emission module. The conventional light emission module may include a laser diode driver 2, a laser diode 3 and a monitor photodiode 4 which are disposed on a base 1. The monitor photodiode 4 is located right behind the laser diode 3. In order to prevent a light incident on a light receiving surface of the monitor photodiode 4 from being reflected back to the laser diode 3, a specific angle between the light receiving surface of the monitor photodiode 4 and an emission axis of the laser diode 3 is preferred. For reducing a distance between the laser diode 3 and the laser diode driver 2, the laser diode 3 and the monitor photodiode 4 are located at a lateral side of the laser diode driver 2 so that the laser diode 3 is close to the laser diode driver 2. However, the above structure occupies a great space on the base 1 so that a width of the base is overly large, thereby increasing the volume of the light emission module.

Figure 2:
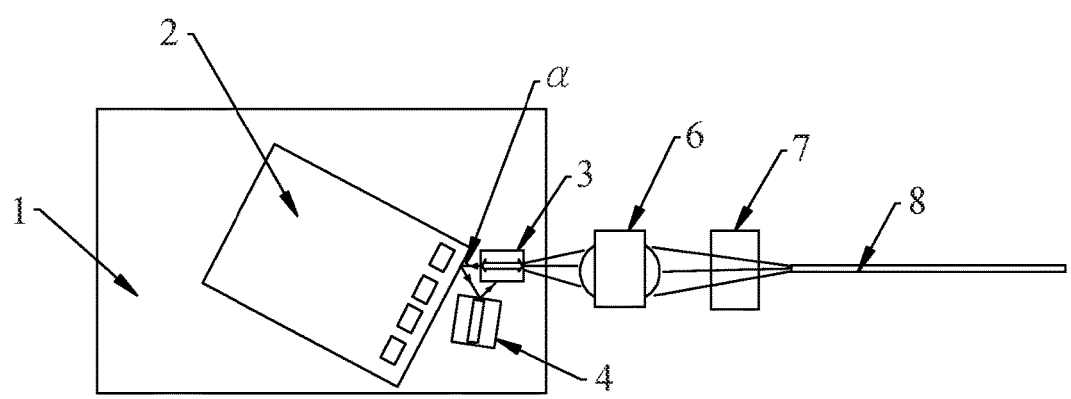
FIG. 2 is a schematic view of a light emission module according to an embodiment of the present disclosure.

Please refer to FIG. 2. FIG. 2 is a schematic view of a light emission module according to an embodiment of the present disclosure. The light emission module in this embodiment of the disclosure includes a base 1, a laser diode driver 2, a laser diode 3 and a monitor photodiode 4. The laser diode driver 2, for example, is a laser diode drive chip. The laser diode driver 2, the laser diode 3 and the monitor photodiode 4 are disposed on the base 1. The laser diode driver 2 may have a front end, a rear end opposite to the front end, and an end surface located at the front end. The laser diode 3 may have a front side, a rear side opposite to the front side, a lateral side located between the front side and the rear side, and a side surface located at the rear side. The front end of the laser diode driver 2 is closer to the rear side of the laser diode 3 than the rear end. The front side of the laser diode 3 may be closer to an optical fiber 8 than the rear side.

The monitor photodiode 4 and the laser diode 3 are located close to the front end of the laser diode driver 2. The rear side of the laser diode 3 faces the laser diode driver 2. The monitor photodiode 4 has a light receiving surface. The end surface of the laser diode driver 2, the light receiving surface of the monitor photodiode 4 and the end surface of the laser diode 3 are arranged in a triangle shape for reflecting a light emitted from the rear side of the laser diode 3 to the light receiving surface of the monitor photodiode 4 by the end surface of the laser diode driver 2.

The laser diode driver 2 may drive the laser diode 3 to emit a laser. The laser is emitted from the front side of the laser diode 3, passes through a lens 6 and an isolation device 7, and then the laser travels into the optical fiber 8. The laser diode driver 2 drives the laser diode 3 to emit laser. When the laser is emitted from the front side of the laser diode 3, the rear side of the laser diode 3 also emits a little light. The light emitted from the rear side of the laser diode 3 is detected by the monitor photodiode 4 for monitoring the operation of the laser diode 3.

According to the structure of the light emission module described above, the light emitted from the rear side of the laser diode 3 is reflected to the light receiving surface of the monitor photodiode 4 by the end surface of the laser diode driver 2; therefore, the monitor photodiode 4 can monitor the operation of the laser diode 3. Moreover, the monitor photodiode 4 and the laser diode 3 can be disposed close to the front end of the laser diode driver 2 but the lateral side of the laser diode driver 2 so that the width of the base 1 is greatly reduced. In addition, the monitor photodiode 4 has no need to be disposed behind the rear side of the laser diode 3, and there is no element disposed between the laser diode 3 and the laser diode driver 2; as a result, the distance between the laser diode and the laser diode driver can be reduced so as to obtain compact light emission module.

In this embodiment, an angle α between the end surface of the laser diode driver 2 and an emission axis of the laser diode 3 is from 20 degrees to 60 degrees. The arrangement of the laser diode driver 2, the laser diode 3 and the monitor photodiode 4 satisfies the above condition so that the light emitted from the rear side of the laser diode 3 can be incident on the light receiving surface of the monitor photodiode 4 by the reflection of the end surface of the laser diode driver 2. Moreover, the arrangement of the laser diode driver 2, the laser diode 3 and the monitor photodiode 4 satisfying the above condition also reduces the distance between each other. Therefore, a spaced occupied by the laser diode driver 2, the laser diode 3 and the monitor photodiode 4 on the base 1 is reduced.

Moreover, the angle α between the end surface of the laser diode driver 2 and the emission axis of the laser diode 3 is from 35 degrees to 45 degrees. The light emission module of the disclosure satisfying the above condition is more preferable for minimizing the distances between every two elements in the light emission module.

In this embodiment, the monitor photodiode 4 is tilted for reflecting the light incident on the light receiving surface of the monitor photodiode 4 from the end surface of the laser diode driver 2 to the lateral side of the laser diode 3. This structure prevents reflecting the light incident on the light receiving surface of the monitor photodiode 4 into the laser diode 3. Specifically, the interference between the light reflected by the light receiving surface of the monitor photodiode 4 and the laser emitted by the laser diode 3 can be prevented. The monitor photodiode 4 being tilted means that there is a specific angle between the light receiving surface of the monitor photodiode 4 and the emission axis of the laser diode 3, and the specific angle may be about 5 degrees. Therefore, the light incident on the light receiving surface of the monitor photodiode 4 by the reflection of the end surface of the laser diode driver 2 is reflected again by the light receiving surface of the monitor photodiode 4. The light reflected by the light receiving surface of the monitor photodiode 4 is incident on the lateral side of the laser diode 3 but enter into the laser diode 3.

What is claimed is:

1. A light emission module comprising a base, a laser diode driver, a laser diode and a monitor photodiode, the laser diode driver, the laser diode and the monitor photodiode each disposed on a top surface of the base, the laser diode having a front side opposite a rear side, the front side of the laser diode being optically coupled to an optical fiber and the rear side of the laser diode facing the laser diode driver such that light emitted from the rear side of the laser diode is incident on a surface of the laser diode driver facing the rear side of the laser diode, the light incident on the laser diode driver is reflected from the laser diode driver along the top surface of the base in a direction transverse to an emission axis of the laser diode such that the reflected light is incident on a light receiving surface of the monitor photodiode.

2. The light emission module of claim 1, wherein an angle between the surface of the laser diode driver facing the rear side of the laser diode and the emission axis of the laser diode is from 20 degrees to 60 degrees.

3. The light emission module of claim 2, wherein the angle between the surface of the laser diode driver facing the rear side of the laser diode and the emission axis of the laser diode is from 35 degrees to 45 degrees.

4. The light emission module of claim 1, wherein the monitor photodiode is tilted for reflecting the light incident on the light receiving surface of the monitor photodiode to a lateral side of the laser diode that faces the monitor photodiode, wherein the lateral side of the laser diode extends between the front side of the laser diode and the rear side of the laser diode.

5. A light emission module comprising a base, a laser diode driver, a laser diode and a monitor photodiode, the laser diode driver, the laser diode and the monitor photodiode disposed on the base, the laser diode having a front side opposite a rear side, the front side of the laser diode being optically coupled to an optical fiber and the rear side of the laser diode facing the laser diode driver such that light emitted from the rear side of the laser diode is incident on a surface of the laser diode driver facing the rear side of the laser diode, the light incident on the laser diode driver is reflected from the laser diode driver such that the reflected light is incident on a light receiving surface of the monitor photodiode, wherein the monitor photodiode is tilted such that the light receiving surface of the monitor photodiode is angled relative to an emission axis of the laser diode.

6. The light emission module of claim 5, wherein an angle between the surface of the laser diode driver facing the rear side of the laser diode and the emission axis of the laser diode is from 20 degrees to 60 degrees.

7. The light emission module of claim 6, wherein the angle between the surface of the laser diode driver facing the rear side of the laser diode and the emission axis of the laser diode is from 35 degrees to 45 degrees.

8. A light emission module comprising a base, a laser diode driver, a laser diode and a monitor photodiode, the laser diode driver, the laser diode and the monitor photodiode disposed on the base, the laser diode having a front side opposite a rear side, the front side of the laser diode being optically coupled to an optical fiber and the rear side of the laser diode facing the laser diode driver such that light emitted from the rear side of the laser diode is incident on a surface of the laser diode driver facing the rear side of the laser diode, the light incident on the laser diode driver is reflected from the laser diode driver such that the reflected light is incident on a light receiving surface of the monitor photodiode, the light receiving surface of the monitor photodiode reflecting light incident on the light receiving surface of the monitor photodiode to a lateral side of the laser diode that faces the monitor photodiode, the lateral side of the laser diode extending between the front side of the laser diode and the rear side of the laser diode.

9. The light emission module of claim 8, wherein an angle between the surface of the laser diode driver facing the rear side of the laser diode and an emission axis of the laser diode is from 20 degrees to 60 degrees.

10. The light emission module of claim 9, wherein the angle between the surface of the laser diode driver facing the rear side of the laser diode and the emission axis of the laser diode is from 35 degrees to 45 degrees.

\* \* \* \* \*